United States Patent
Heuck et al.

(10) Patent No.: US 9,659,793 B2
(45) Date of Patent: May 23, 2017

(54) METHOD FOR PRODUCING A MATERIAL-BONDING CONNECTION BETWEEN A SEMICONDUCTOR CHIP AND A METAL LAYER

(71) Applicant: Infineon Technologies AG, Neubiberg (DE)

(72) Inventors: Nicolas Heuck, Cremlingen (DE); Frederik Otto, Castrop-Rauxel (DE); Christian Steininger, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/943,511

(22) Filed: Nov. 17, 2015

(65) Prior Publication Data

US 2016/0148819 A1 May 26, 2016

(30) Foreign Application Priority Data

Nov. 20, 2014 (DE) .................. 10 2014 117 020

(51) Int. Cl.
| | |
|---|---|
| *H01L 21/00* | (2006.01) |
| *H01L 21/48* | (2006.01) |
| *H01L 23/00* | (2006.01) |

(52) U.S. Cl.
CPC ...... *H01L 21/4825* (2013.01); *H01L 21/4842* (2013.01); *H01L 24/27* (2013.01); *H01L 24/75* (2013.01); *H01L 24/83* (2013.01); *H01L 24/29* (2013.01); *H01L 24/32* (2013.01); *H01L 2224/27003* (2013.01); *H01L 2224/27005* (2013.01); *H01L 2224/2732* (2013.01);
(Continued)

(58) Field of Classification Search
None
See application file for complete search history.

(56) References Cited

U.S. PATENT DOCUMENTS

| 4,667,870 A * | 5/1987 | Avedissian .......... H01L 21/6838 228/1.1 |
| 2009/0096100 A1* | 4/2009 | Kajiwara .......... H01L 23/49513 257/741 |

(Continued)

FOREIGN PATENT DOCUMENTS

| JP | 4362742 B2 | 11/2009 |
| WO | 2013185839 A1 | 12/2013 |

*Primary Examiner* — Angel Roman
(74) *Attorney, Agent, or Firm* — Murphy, Bilak & Homiller, PLLC

(57) ABSTRACT

A method for producing a material-bonding connection between a semiconductor chip and a metal layer is disclosed. For this purpose, a semiconductor chip, a metal layer, which has a chip mounting portion, and also a bonding medium containing a metal powder are provided. The metal powder is sintered in a sintering process. In this case, throughout a prescribed sintering time, the prescribed requirements are met, that the bonding medium is arranged between the semiconductor chip and the metal layer and extends right through from the semiconductor chip to the metal layer, that the semiconductor chip and the metal layer are pressed against one another in a pressing-pressure range that lies above a minimum pressing pressure, that the bonding medium is kept in a temperature range that lies above a minimum temperature and that a sound signal is introduced into the bonding medium.

16 Claims, 3 Drawing Sheets

(52) U.S. Cl.
CPC ............... *H01L 2224/2744* (2013.01); *H01L 2224/27442* (2013.01); *H01L 2224/27848* (2013.01); *H01L 2224/2939* (2013.01); *H01L 2224/29294* (2013.01); *H01L 2224/29295* (2013.01); *H01L 2224/29339* (2013.01); *H01L 2224/29344* (2013.01); *H01L 2224/29347* (2013.01); *H01L 2224/29364* (2013.01); *H01L 2224/29369* (2013.01); *H01L 2224/29373* (2013.01); *H01L 2224/32227* (2013.01); *H01L 2224/32245* (2013.01); *H01L 2224/75252* (2013.01); *H01L 2224/75315* (2013.01); *H01L 2224/75343* (2013.01); *H01L 2224/75745* (2013.01); *H01L 2224/832* (2013.01); *H01L 2224/8322* (2013.01); *H01L 2224/83048* (2013.01); *H01L 2224/8384* (2013.01); *H01L 2224/83191* (2013.01); *H01L 2224/83192* (2013.01); *H01L 2224/83203* (2013.01); *H01L 2224/83207* (2013.01); *H01L 2224/83208* (2013.01); *H01L 2224/83424* (2013.01); *H01L 2224/83447* (2013.01); *H01L 2224/83986* (2013.01)

(56) References Cited

U.S. PATENT DOCUMENTS

| | | | |
|---|---|---|---|
| 2009/0230172 A1* | 9/2009 | Ogashiwa | H01L 24/11 228/110.1 |
| 2010/0093131 A1* | 4/2010 | Maeda | B23K 1/0016 438/107 |
| 2012/0106109 A1* | 5/2012 | Kim | H01L 24/83 361/771 |
| 2013/0328204 A1* | 12/2013 | Zommer | H01L 24/09 257/765 |
| 2015/0123263 A1* | 5/2015 | Frueh | H01L 24/27 257/734 |
| 2015/0146399 A1* | 5/2015 | Viswanathan | H01L 24/83 361/785 |

* cited by examiner

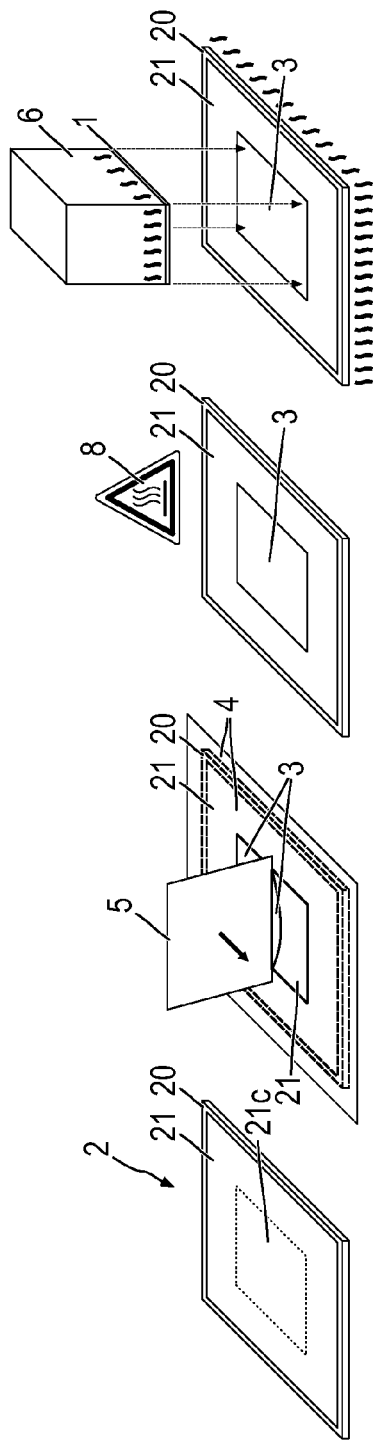

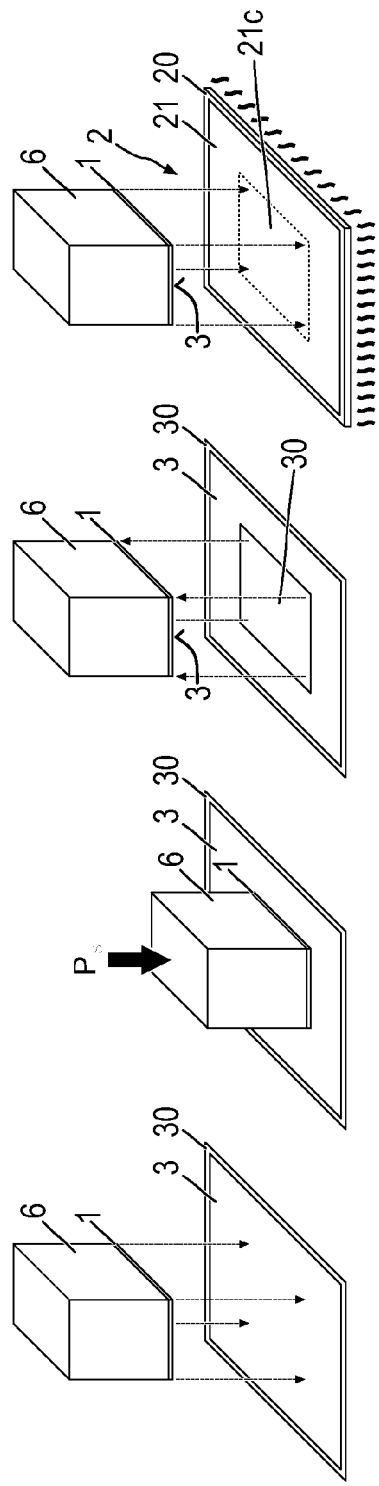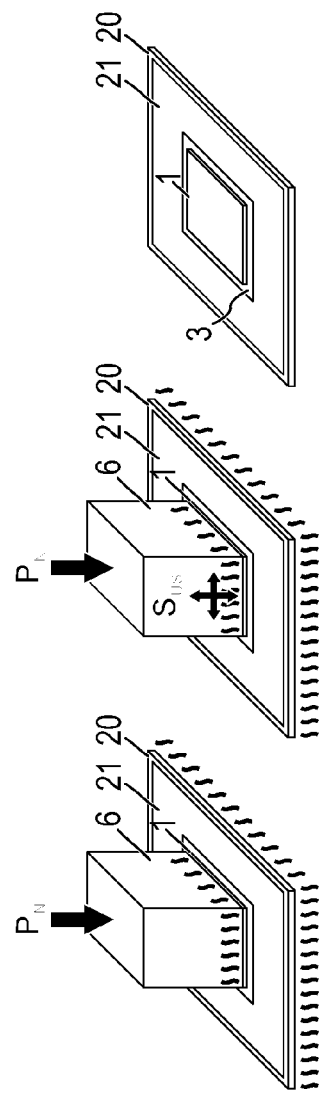

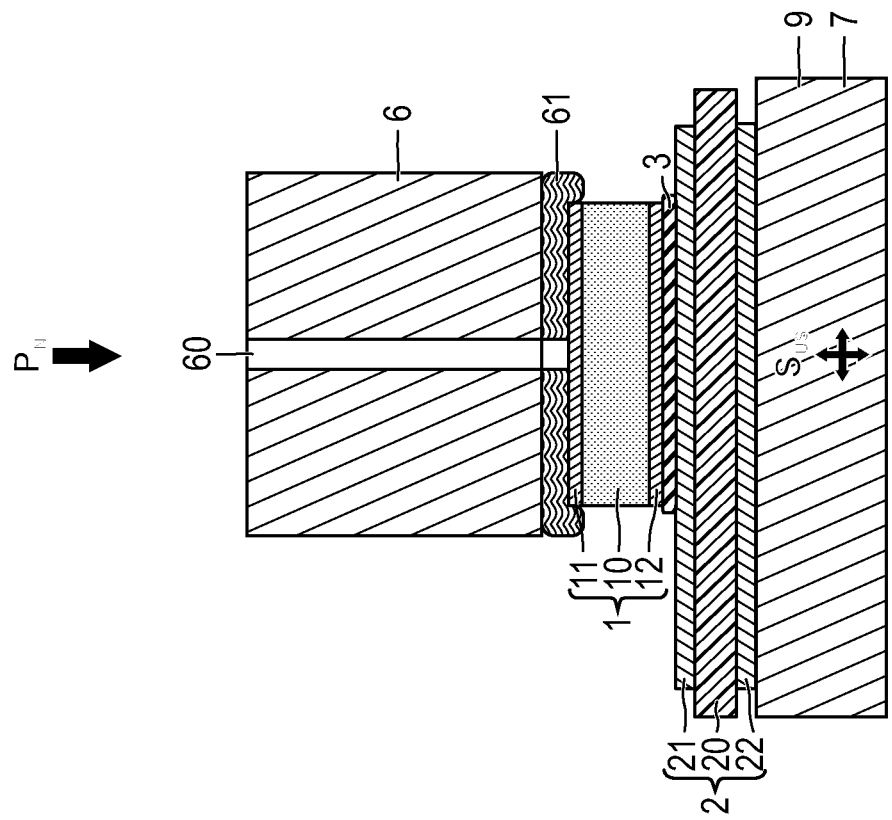
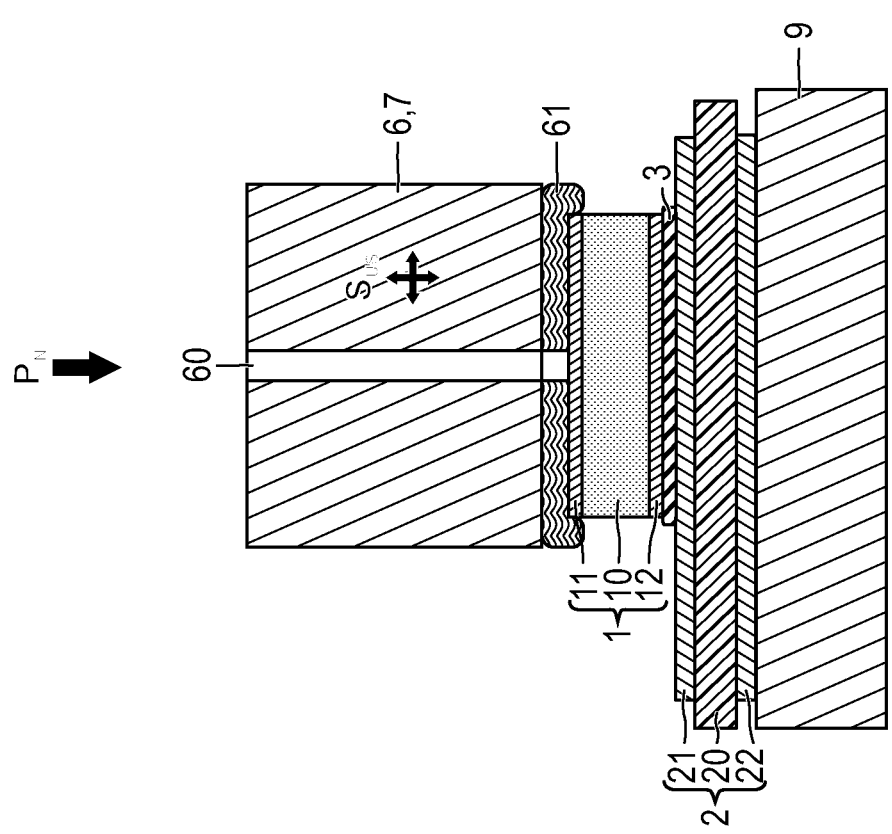

METHOD FOR PRODUCING A MATERIAL-BONDING CONNECTION BETWEEN A SEMICONDUCTOR CHIP AND A METAL LAYER

PRIORITY CLAIM

This application claims priority to German Patent Application No. 10 2014 117 020.2 filed on 20 Nov. 2014, the content of said application incorporated herein by reference in its entirety.

TECHNICAL FIELD

The invention relates to a method for producing a material-bonding connection between a semiconductor chip and a metal layer.

BACKGROUND

Owing to increasing power densities, more compact types of construction and new areas of use, it is likely that the operating temperatures of semiconductor chips will increase further in the future. Whenever the semiconductor chips are mounted on a circuit carrier with the aid of a bonding medium, the bonding medium must also be able to satisfy higher requirements with regard to thermal endurance.

Recently, the soft-solder connections that are usually used as a bonding medium have increasingly been replaced by connecting layers that contain a sintered metal powder. Such sintered connections have a greater mechanical stability at high application temperatures than soft-solder connections. However, the production of such sintered connections is time-intensive, since the semiconductor chip and the metal layer must be pressed against one another for a certain minimum time under increased pressure and at an increased sintering temperature. Although the minimum time could in principle be reduced by increasing the pressing pressure and/or by increasing the sintering temperature, a higher pressing pressure entails the risk of chip breakage—especially in the case of large-area semiconductor chips such as are used in power electronics—while high sintering temperatures may significantly change the electrical properties of the semiconductor chip.

SUMMARY

The object of the embodiments described herein is therefore to provide a time-efficient method for producing a thermally stable material-bonding connection between a semiconductor chip and a metal layer. This object is achieved by a method for producing a material-bonding connection between a semiconductor chip and a metal layer according to patent claim 1. Refinements and developments of the invention are the subject of subclaims.

For producing a material-bonding connection between a semiconductor chip and a metal layer, a semiconductor chip and a metal layer are provided, as well as a bonding medium that contains a metal powder. The metal powder is sintered in a sintering process. Throughout a prescribed sintering time, the prescribed requirements are met, that the bonding medium is arranged between the semiconductor chip and the metal layer and extends right through from the semiconductor chip to the metal layer, that the semiconductor chip and the metal layer are pressed against one another in a pressing-pressure range that lies above a minimum pressing pressure, that the bonding medium is kept in a temperature range that lies above a minimum temperature and that a sound signal is introduced into the bonding medium.

By introducing the sound signal into the bonding medium, the sintering time can be significantly reduced in comparison with conventional sintering processes in which no sound signal is introduced into the bonding medium.

BRIEF DESCRIPTION OF THE DRAWINGS

The invention is explained below on the basis of exemplary embodiments with reference to the accompanying figures, in which:

FIGS. 1A to 1G show various steps of a first method for producing a material-bonding connection between a semiconductor chip and a metal layer, according to an embodiment.

FIGS. 2A to 2G show various steps of a second method for producing a material-bonding connection between a semiconductor chip and a metal layer, according to an embodiment.

FIG. 3 shows a method in which a sound signal is introduced into the bonding medium by way of the semiconductor chip to produce a material-bonding connection between a semiconductor chip and a metal layer, according to an embodiment.

FIG. 4 shows a method in which a sound signal is introduced into the bonding medium by way of the metal layer to produce a material-bonding connection between a semiconductor chip and a metal layer, according to an embodiment.

The representations in the figures are not to scale. Unless otherwise indicated, in the figures the same designations denote elements that are the same or have the same effect.

DETAILED DESCRIPTION

FIG. 1A shows a metal layer 21, on which a semiconductor chip is later mounted. The metal layer may in principle be any desired metal layer. It may take the form of a single part, for example a leadframe, or else a component part of a circuit carrier 2. In the case of the example represented, the metal layer 21 is a component part of a circuit carrier 2, which has at least one dielectric insulation carrier 20, for example a ceramic, and also an optional, lower metal layer 22, such as that which is also represented in FIGS. 3 and 4.

The metal layer 21 may be flat overall, or else curved. At least it may have a flat chip mounting portion 21c, on which the semiconductor chip is later mounted. A flat mounting area makes chip mounting easier and reduces the risk of chip breakage.

Irrespective of whether the chip mounting portion 21c is flat or not, a bonding medium 3 is applied to the prescribed chip mounting portion 21c, which may in principle be performed in any way desired. The bonding medium 3 contains at least a metal powder. Precious metals, such as silver, gold, platinum, palladium, rhodium, but also nonprecious metals, such as for example copper, are especially suitable as metals for the metal powder. The metal powder may consist completely of just one of the metals mentioned or comprise just one of these metals, but it may also consist of metal powder mixtures with two or more of the metals mentioned or comprise such a metal powder mixture.

Silver is used with preference as the metal, since the sintered layer produced from it has an outstanding electrical and thermal conductivity, which is especially of importance in the area of power electronics, for example when power semiconductor chips are to be cooled by way of the finished sintered connecting layer. The particles of the metal powder may for example be formed as grains, and/or as flat flakes.

The bonding medium 3 may for example be a paste 3, which apart from the metal powder also contains a solvent. A paste can be easily applied to the chip mounting portion 21c and/or to the semiconductor chip. FIG. 1B shows an example of this. Here, the bonding medium 3 is applied to the metal layer 21 by means of a squeegee blade 5, which, as is likewise shown, may optionally be performed by using a stencil 4, which during the application of the bonding medium 3 is arranged above the metal layer 21 and has above the chip mounting portion 21c a clearance through which the bonding medium 3 is applied to the chip mounting portion 21c in the stencil printing. For this purpose, the squeegee blade 5, with its lower edge facing the chip mounting portion 21c resting on the stencil 4, is drawn over the clearance in the stencil 4 in such a way that a layer of the bonding medium 3 is left behind on the chip mounting portion 21c. The profile of the edges of the circuit carrier 2 that are covered by the stencil 4 is represented in FIG. 1B by dashed lines.

Instead of a stencil, a screen with a large number of screen openings could also be used, some of which screen openings are closed, but some of which, located above the chip mounting portion 21c, are unclosed, so that the bonding medium 3 can be applied to the chip mounting portion 21c through the unclosed openings during the screen printing. However, it is similarly also possible to apply the bonding medium to the chip mounting portion 21c without a stencil or a screen.

As represented furthermore in FIG. 10, the bonding medium 3 applied to the chip mounting portion 21c or the bonding medium 3 applied to the metal layer 21 may be dried, with at least some of the solvent being removed from the bonding medium 3. In order to speed up the drying operation, the applied bonding medium 3 may be heated to temperatures that are higher than room temperature (20° C.), for example to temperatures that are at least 50° C., at least 100° C. or at least 150° C., and/or are at most 250° C. The drying may be performed for example in air. Furthermore, grinding waxes that can be added to the metal powder as part of the production process and are intended to avoid an agglomeration or fusing of the silver particles before the actual sintering process step are evaporated during the drying operation. The heating of the applied bonding medium 3 may be performed with the aid of any desired heating device 8, which in FIG. 10 is only represented schematically.

After the drying of the bonding medium 3, a semiconductor chip 1 may be placed onto the dried bonding medium 3 on the chip mounting portion 21c in such a way that the dried bonding medium 3 is located between the semiconductor chip 1 and the chip mounting portion 21c and extends right through from the semiconductor chip 1 to the chip mounting portion 21c, and consequently to the metal layer 21.

The placement may in principle be performed in any way desired. For example, a placing tool 6 may be used for this, which picks up the semiconductor chip 1 provided and places it on the dried bonding medium 3 above the chip mounting portion 21c, which is represented in FIG. 1D by arrows and the result of which is shown in FIG. 1E.

According to an option that is likewise represented in FIGS. 1D and 1E (by stylized flames in the placing tool 6), the placing tool 6 may be heated or heatable, so that the semiconductor chip 1 picked up by it is preheated before it is placed onto the dried bonding medium 3 (FIG. 1D), for example to temperatures which, for reasons of reliability, lie somewhat (e.g. 10 K) above the temperature that is required for the metal powder contained in the bonding medium 3 to sinter. In the case of a metal powder comprising silver, but also for all other precious-metal or copper powders, preheating temperatures of at least 100° C. are suitable for example. Optionally, the preheating temperatures may be chosen to be less than 400° C., in order to keep down the thermal loading of the semiconductor chip. For the heating or preheating of the placing tool 6, it may for example have integrated resistance heating.

As an alternative or in addition, according to yet another option represented in FIG. 1D (by stylized flames under the metal layer 21), the metal layer 21 may be heated, so that the bonding medium 3 applied to the chip mounting portion 21c is preheated by way of the metal layer 21, for example to temperatures of at least 100° C., which likewise speeds up the subsequent sintering operation, and optionally to temperatures of less than 400° C. The heating may be performed for example by means of a heat source not represented in detail, which heats the metal layer 21 by way of its side that is facing away from the applied bonding medium 3. The heat source may be for example a heatable and/or preheated block, for example a metal block, which is brought into contact with the side that is facing away from the applied bonding medium 3. For the heating or preheating of the block, it may for example have integrated resistance heating. Similarly, however, a hot-air blower or radiation heating may also be used as the heat source.

As represented furthermore in FIG. 1E, the semiconductor chip 1 is pressed with a pressing pressure $P_N$ against the chip mounting portion 21c, and consequently against the metal layer 21. Optionally, the pressing pressure $P_N$ may be produced by the placing tool 6, for which purpose a support that is not represented and forms an abutment is required on the side of the metal layer 21 that is facing away from the placing tool 6. Irrespective of the manner in which it is produced, the range of the pressing pressure may be chosen such that it lies above a minimum pressing pressure, for example above 0.1 MPa.

The pressing is also performed in such a way that the bonding medium 3 is at the same time at high temperatures, so that the metal powder contained in the bonding medium 3 is sintered and a stable sintered metal powder layer is created, also connecting the semiconductor chip 1 and the metal layer 21 in a secure, material-bonding manner. For example, the temperatures of the bonding medium 3 may be kept during the pressing to temperatures that lie above a minimum temperature, for example above 100° C.

Alternatively, it would also be possible to remove the placing tool 6 from the semiconductor chip 1 placed on the chip mounting portion 21c provided with the bonding medium 3 and to carry out the pressing and heating by means of a separate press, into which the stack comprising the metal layer 21, the bonding medium 3 applied to the chip mounting portion 21c and the semiconductor chip 1 placed on the bonding medium 3 is inserted.

As also represented in FIG. 1F, for the sintering a sound signal $S_{US}$ is introduced into the bonding medium 3. Used for this purpose is a sound generator (not represented), for example a piezoelectric sound generator, which may for example be integrated in the placing tool 6. The sound signal $S_{US}$ introduced brings about a supply of energy and a densification of the metal powder contained in the bonding medium 3, whereby both the sintering time can be shortened and the quality of the sintered connection can be increased (reduction in the degree of porosity).

The sintering of the metal powder in any event takes place in a sintering process in which, throughout a prescribed sintering time, the prescribed requirements are met, that the bonding medium 3 is arranged between the semiconductor chip 1 and the metal layer 21 and extends right through from the semiconductor chip 1 to the metal layer 21, that the semiconductor chip 1 and the metal layer 21 are pressed against one another in a pressing-pressure range that lies above a minimum pressing pressure, that the bonding medium 3 is kept in a temperature range that lies above a minimum temperature and that a sound signal $S_{US}$ is introduced into the bonding medium 3.

FIG. 1G shows the finished assembly, in which the semiconductor chip 1 and the metal layer 21 are connected to one another in a secure and material-bonding manner, and also optionally an electrically conducting manner, by the sintered bonding medium 3.

A further method for producing a material-bonding connection between a semiconductor chip 1 and a metal layer 21 is now explained on the basis of FIGS. 2A to 2G.

FIG. 2A shows a carrier 30, to which a bonding medium 3 has been applied. A transfer film may be used for example as the carrier 30, but also a rigid carrier.

The applied bonding medium 3 may be in the form of a layer, in particular a flat layer. The bonding medium 3 may similarly be composed like the bonding medium 3 explained above. It can, but does not have to, have a solvent. If it contains a solvent, it takes the form of a paste. It may, however, also take the form of a dry or substantially dry powder that contains a metal powder such as that already described with reference to FIGS. 1A to 1G. Furthermore, the substantially dry powder may also contain grinding wax.

Then, as indicated in FIG. 2A by arrows and with the result shown in FIG. 2B, the semiconductor chip 1 is placed onto the applied bonding medium (3), which may for example be performed with the aid of a placing tool 6, but in principle in any way desired.

After placement, the semiconductor chip 1 is pressed by the placing tool or in some other way with a pressing pressure $P_S$ against the applied bonding medium 3, so that the bonding medium 3 adheres to the semiconductor chip 1. The pressing pressure $P_S$ may for example be chosen to be greater than 0.1 MPa and/or less than 20 MPa.

Before and/or after placement on the bonding medium 3, the semiconductor chip 1 may be heated up to temperatures that lie above room temperature, for example to more than 50° C., in order to achieve secure adhesion of the bonding medium 3 to the semiconductor chip 1. The temperatures of the bonding medium 3, the semiconductor chip 1 and the metal layer 21 in this case lie below the temperature at which the metal powder contained in the bonding medium 3 significantly sinters.

The semiconductor chip 1 with the bonding medium 3 adhering to it can then be placed, for example by means of the placing tool 6 or in some other way, onto the chip mounting portion 21c of a metal layer 21 in such a way that the bonding medium 3 is located between the semiconductor chip 1 and the chip mounting portion 21c and extends right through from the semiconductor chip 1 to the chip mounting portion 21c, and consequently to the metal layer 21, which is represented in FIG. 2D by arrows and the result of which is shown in FIG. 2E.

According to an option that is represented in FIGS. 2D and 2E (by stylized flames in the placing tool 6), the metal layer 21 may be heated, for example to temperatures of at least 100° C., so that the sintering process commences almost without any delay after the placement of the semiconductor chip 1, including the bonding medium 3 adhering to it, on the metal layer 21, as a result of which the process time can be reduced significantly. Optionally, the metal layer 21 may be heated during the preheating to temperatures that are less than 400° C., in order to keep down the thermal loading of the semiconductor chip 1 after being placed. The heating of the metal layer 21 may for example be performed by means of a heat source, as already explained with reference to FIGS. 1A to 1G.

In a way similar to in the case of the method explained on the basis of FIGS. 1A to 1G, it is also possible in the case of the method according to FIGS. 2A to 2G that the placing tool 6 is heated or heatable, to be precise in one of the same ways that have already been described.

In order to prevent the bonding medium 3 that is adhering to the semiconductor chip 1 from significantly beginning to sinter already before the semiconductor chip 1 with the bonding medium 3 adhering to it is placed onto the chip mounting portion 21c, the semiconductor chip 1 may be kept at temperatures that are so low that the metal powder that is in the bonding medium 3 does not begin to sinter, or not significantly, for example at temperatures in the range of less than 100° C., from the placement of the semiconductor chip 1 on the carrier 30 provided with the bonding medium 3 (FIG. 2B) to the placement of the semiconductor chip 1 with the bonding medium 3 adhering to it on the metal layer 21.

After placement of the semiconductor chip 1 and the bonding medium 3 adhering to it on the chip mounting portion 21c, the placing tool 6 may optionally be heated in order to speed up the sintering of the metal powder that is in the bonding medium 3.

For heating the placing tool 6, it may for example have integrated resistance heating.

The further process steps, represented on the basis of FIGS. 2F and 2G, can then be carried out in the same way and with the same parameters as already explained with reference to the corresponding FIGS. 1F and 1G.

The transfer process explained on the basis of FIGS. 2A to 2G, in which the bonding medium 3 is applied to the semiconductor chip 1 by placing the semiconductor chip 1 onto the carrier 30 provided with the bonding medium 3 and subsequently lifting off the semiconductor chip 1 with the bonding medium 3 adhering to it from the carrier 30, offers the advantage that all of the process steps can be carried out fully automatically on the same machine, whereas the method explained on the basis of FIGS. 1A to 1G requires two additional process steps, to be specific the printing of the bonding medium 3 onto the metal layer 21 (FIG. 1B) and the drying of the printed-on bonding medium 3 (FIG. 1O).

FIG. 3 shows another method, in which a sound signal $S_{US}$ is introduced into the bonding medium 3 by way of the semiconductor chip 1 to produce a material-bonding connection between a semiconductor chip 1 and a metal layer 21. The sound signal $S_{US}$ is generated by means of a sound generator 7, which is not represented any more specifically and may be integrated in the placing tool 6.

The placing tool 6 may also have an optional, elastic pressure pad 61 on the side on which it picks up the semiconductor chip 1, in order to avoid damaging the semiconductor chip 1. Suitable for example as the pressure pad 61 is an elastomer polymer (for example natural or synthetic rubbers and variants thereof), a thermoelastic polymer (for example polytetrafluoroethylene=PTFE), or a thermoplastic polymer (for example polyimide=PI).

Furthermore, the placing tool 6 may have a suction channel 60, by which the semiconductor chip 1 can be sucked onto the placing tool 6 and held on it. If the placing tool 6 has a pressure pad 61, the suction channel 60 may also extend through the pressure pad 61.

Also represented in FIG. 3 is the abutment 9, which is not shown in FIGS. 1A to 1G and 2A to 2G but is nevertheless present.

As illustrated furthermore in FIG. 4, a sound signal $S_{US}$ may also be introduced into the bonding medium 3 by way of the metal layer 21. This sound signal $S_{US}$ is generated by means of a sound generator 7, which is not represented any more specifically and may be integrated in the abutment 9.

It is similarly possible of course to introduce a partial signal of the sound signal $S_{US}$ into the bonding medium 3 by way of the placing tool 6, as explained on the basis of FIG. 3, and a further partial signal by way of the metal layer 21, as explained on the basis of FIG. 4.

The modifications explained on the basis of FIGS. 3 and 4 can also be used in particular in the case of the methods explained on the basis of FIGS. 1A to 1G and 2A to 2G.

Irrespective of the way in which the sound signal $S_{US}$ is generated and introduced, it may have one or more frequencies in the range from 1 kHz to 1 GHz. Optionally, the sound signal may for example also be an ultrasound signal, which has a frequency in the range from 20 kHz to 1 GHz.

The sound signal $S_{US}$ may in this case have an amplitude of at least 0.5 µm in a direction parallel to the chip mounting portion 21c, and/or an amplitude of at least 0.5 µm in a direction perpendicular to the chip mounting portion 21c.

As also illustrated in particular in FIGS. 3 and 4, the placing tool 6 may completely cover over the semiconductor chip 1 during the sintering time.

As already mentioned above, the metal layer 21 may be a single metal part, such as for example a leadframe, or, as represented merely by way of example in the preceding figures, a metallization layer 21 of a circuit carrier 2, also see especially FIGS. 3 and 4.

The circuit carrier 2 has a dielectric insulation carrier 20, to which an upper metallization layer 21 has been applied, and also an optional lower metallization layer 22. If there is an upper and a lower metallization layer 21, 22, they are located on sides of the insulation carrier 20 opposite from one another. The upper metallization layer 21 may, if required, be structured, so that it has conductor tracks, which can be used for example for electrical interconnection and/or for mounting chips. The dielectric insulation carrier 20 can be used for the purpose of electrically insulating the upper metallization layer 21 and the lower metallization layer 22 from one another.

The circuit carrier 2 may be a ceramic substrate, in which the insulation carrier 20 is formed as a thin layer which comprises ceramic or consists of ceramic. Metals with good electrical conduction, such as for example copper or copper alloys, aluminum or aluminum alloys, but also any other metals or alloys, are suitable as materials for the upper metallization layer 21 and, if present, the lower metalization layer. If the insulation carrier 20 comprises ceramic or consists of ceramic, the ceramic may for example be alumina ($Al_2O_3$) or aluminum nitride (AlN) or zirconia ($ZrO_2$), or a mixed ceramic which, in addition to at least one of the ceramic materials mentioned, also comprises at least one other ceramic material different from it. A circuit carrier 2 may for example be formed as a DCB substrate (DCB=Direct Copper Bonding), a DAB substrate (DAB=Direct Aluminum Bonding), an AMB substrate (AMB=Active Metal Brazing) or an IMS substrate (IMS=Insulated Metal Substrate). The upper metallization layer 21 and the lower metalization layer 22, if present, may, independently of one another, have in each case a thickness in the range from 0.05 mm to 2.5 mm. The thickness of the insulation carrier 20 may for example lie in the range from 0.1 mm to 2 mm. However, thicknesses greater or smaller than the thicknesses specified are likewise possible.

The semiconductor chip 1 may in principle be any desired semiconductor chip, for example a MOSFET (Metal Oxide Semiconductor Field Effect Transistor), an IGBT (Insulated Gate Bipolar Transistor), a thyristor, a JFET (Junction Field Effect Transistor), an HEMT (High Electron Mobility Transistor), a diode, etc. The semiconductor chip 1 has a semiconductor body 10 and also, optionally in each case, an upper chip metallization 11 and a lower chip metallization 12. If a semiconductor chip 1 has a lower chip metallization 12, it can be fastened on the metal layer 21 at this metallization. This means that the bonding medium 3 extends right through from the chip mounting portion 21c to the lower chip metallization 12, and connects them to one another in an electrically conducting manner, during the sintering process and after completion of the sintering process.

The connecting methods may in each case be implemented as pick-and-place methods, which means that the sintered connection between the semiconductor chip 1 and the metal layer 21 is already brought about during the placing process, by the placing tool 6 being used both for picking up the semiconductor chip 1 and placing it down on the chip mounting portion 21c and for producing the pressing pressure $P_N$ acting during the sintering time.

All of the variants of the invention can be carried out in such a way that the metal powder contained in the bonding medium 3 is not melted.

With the present invention, the sintering time can be shortened significantly. It may for example be less than 3 min.

What is claimed is:

1. A method for producing a material-bonding connection between a semiconductor chip and a metal layer, comprising:
    providing a semiconductor chip;
    providing a metal layer, which has a chip mounting portion;
    providing a bonding medium containing a metal powder;
    sintering the metal powder in a sintering process, in which throughout a prescribed sintering time the sintering process comprises:
        the bonding medium is arranged between the semiconductor chip and the metal layer and extends right through from the semiconductor chip to the metal layer;
        the semiconductor chip and the metal layer are pressed against one another in a pressing-pressure range that lies above a minimum pressing pressure;
        the bonding medium is kept in a temperature range that lies above a minimum temperature; and
        a sound signal is introduced into the bonding medium,
    wherein the sintering time is shorter than 3 min.

2. The method as claimed in claim 1, in which the minimum pressing pressure is 0.1 MPa.

3. The method as claimed in claim 1, in which the minimum temperature is 100° C.

4. The method as claimed in claim 1, in which before the sintering process the semiconductor chip is picked up by means of a placing tool and placed on the chip mounting portion in such a way that the bonding medium is arranged between the semiconductor chip and the chip mounting portion and extends right through from the semiconductor chip to the chip mounting portion.

5. The method as claimed in claim 4, in which the semiconductor chip and the metal layer are pressed against one another by the placing tool during the sintering time.

6. The method as claimed in claim 4, in which
the bonding medium is applied to the chip mounting portion before the semiconductor chip is placed on the chip mounting portion; and
after that, the semiconductor chip is placed on the bonding medium applied to the chip mounting portion.

7. The method as claimed in claim 4, in which
the bonding medium is provided on a carrier;
before it is placed on the metal layer, the semiconductor chip picked up by the placing tool, by means of the placing tool
  is placed onto the bonding medium located on the carrier, so that the bonding medium adheres to the semiconductor chip; and
  together with the bonding medium adhering to it, is removed from the carrier and placed on the chip mounting portion in such a way that the bonding medium is arranged between the semiconductor chip and the chip mounting portion and extends right through from the semiconductor chip to the chip mounting portion.

8. The method as claimed in claim 4, in which the placing tool completely covers over the semiconductor chip during the sintering time.

9. The method as claimed in claim 4, in which the sound signal or a partial signal of the sound signal is introduced into the bonding medium by way of the placing tool.

10. The method as claimed in claim 1, in which the sound signal or a partial signal of the sound signal is introduced into the bonding medium by way of the metal layer.

11. The method as claimed in claim 1, in which the sound signal has an amplitude of at least 0.5 µm in a direction parallel to the chip mounting portion.

12. The method as claimed in claim 1, in which the sound signal has an amplitude of at least 0.5 µm in a direction perpendicular to the chip mounting portion.

13. The method as claimed in claim 1, in which the metal powder is not melted during the sintering time.

14. The method as claimed in claim 1, wherein a frequency of the sound signal is below 20 KHz.

15. The method as claimed in claim 1, wherein the metal layer is a metallization layer having a thickness in the range of 0.05 mm to 2.5 mm, or a lead frame.

16. A method for producing a material-bonding connection between a semiconductor chip and a metal layer, comprising:
providing a semiconductor chip;
providing a metal layer, which has a chip mounting portion;
providing a bonding medium containing a metal powder;
sintering the metal powder in a sintering process, in which throughout a prescribed sintering time the sintering process comprises:
  the bonding medium is arranged between the semiconductor chip and the metal layer and extends right through from the semiconductor chip to the metal layer;
  the semiconductor chip and the metal layer are pressed against one another in a pressing-pressure range that lies above a minimum pressing pressure;
  the bonding medium is kept in a temperature range that lies above a minimum temperature; and
  a sound signal is introduced into the bonding medium, wherein a frequency of the sound signal is below 20 KHz.

* * * * *